Aug. 5, 1969 J. G. HAYNOS 3,459,391

INTERCONNECTION OF SOLAR CELLS

Filed Feb. 13, 1964 2 Sheets-Sheet 1

INVENTOR.
JOSEPH G. HAYNOS

BY G. D. O'Brien
Earl Levy
ATTORNEYS

Aug. 5, 1969 J. G. HAYNOS 3,459,391

INTERCONNECTION OF SOLAR CELLS

Filed Feb. 13, 1964 2 Sheets-Sheet 2

INVENTOR
JOSEPH G. HAYNOS

BY G D O'Brien
Earl Levy
ATTORNEYS 3,459,391

INTERCONNECTION OF SOLAR CELLS

Joseph G. Haynos, Rockville, Md., assignor to the United States of America as represented by the National Aeronautics and Space Administration Filed Feb. 13, 1964, Ser. No. 344,793
Int. Cl. B64c *39/02;* H02n *11/00;* H01v *1/30*
U.S. Cl. 244—1 16 Claims

ABSTRACT OF THE DISCLOSURE

Solar cells are interconnected by expanded metal strips to produce a matrix having good electrical and mechanical performance and, at the same time, capable of taking a variety of configurations. Moreover, since the expanded metal strips have the characteristics of being both flexible and resilient, they permit a solar cell array to be constructed such that it can be stored in a rolled-up condition and, at a predetermined time, be extended to form a large surface.

The invention described herein may be manufactured and used by or for the Government of the United States of America for governmental purposes without the payment of any royalties thereon or therefor.

The present invention relates to improved solar cell mounting arrangements for use on space vehicles and satellites, and more particularly, to solar cell mounting arrangements wherein barrier layer type (P/N or N/P junction) semiconductor solar cells are interconnected by means of expanded metal.

Prior to the instant invention solar cells were interconnected to form a rigid structure or paddle member by a shingled technique, e.g., in the manner taught by Dickson, Jr., Patent No. 2,938,938, or by the use of buss bars or the like. Due to the manner in which the solar cells are interconnected in the formation of such rigid solar cell structures, the solar cells are limited to the thermal and vibrational shock that they can withstand before they are damaged. Furthermore, since the entire structure is rigid, it is limited to the manner in which the cells can be laid out, i.e., there is only a limited number of configuration that the paddle can have. In addition, in many instances adequate reliability cannot be achieved because of insufficient electrical connection points being provided between adjacent solar cells.

While the shingled technique is the most widely used, it has the disadvantage of not always permitting the whole area of the solar cells to be exposed to a light source since a portion of the surface of each solar cell may be covered by the shadow of an adjacent solar cell, depending on the angle of the light source to the paddle on which the cells are mounted. Further, the shingled technique is limited to the number of solar cells that can be interconnected to form a subassembly or module of solar cells.

The present invention overcomes the prior art disadvantages by permitting a wide variety of configurations to be achieved with the solar cells—including both rigid as well as flexible structures. At the same time, it provides an interconnection that will withstand vibrational and thermal shock, gives excellent conductivity from cell to cell and/or group to group of cells, adds only a minimal amount of weight to the system, and lends itself to assembly methods of production—all this being accomplished with increased reliability.

Accordingly, it is an object of this invention to provide an improved solar cell interconnecting means that will permit a solar cell matrix to be formed which better withstands thermal and vibrational shock and which has increased reliability.

It is another object of this invention to provide a means for forming a flexible solar cell matrix.

It is a further object of this invention to provide a flexible solar cell interconnecting means which provides good electrical conductivity from cell to cell and/or group to group of cells, which adds only a minimal amount of weight to the system, and which allows solar cells to be interconnected in parallel series or series-parallel.

It is still another object of this invention to provide flexible solar cell assemblies.

These and other objects are carried out by the use of expanded metal as an interconnection means for the solar cells forming a solar cell matrix. The expanded metal is chosen to have a dimension such that it will be both flexible and somewhat resilient. Due to these characteristics the solar cells can be interconnected to form a matrix having a variety of configurations. If, for example, a solar cell matrix is to comprise a number of rows of solar cells having series-parallel interconnections, the cells of the separate rows are interconnected in an over-under technique by strips of expanded metal, i.e., the first row of solar cells have the top surface thereof interconnected with the bottom surface of an adjacent row of solar cells by a strip of expanded metal. The other rows of cells are interconnected in the like manner as the first two. While all connections of the strips of the expanded metal to the solar cells are by solder, other techniques can be used equally as well. A solar cell matrix of this type can be attached to a substrate (base member) by an insulative adhesive to form either a rigid or flexible solar paddle depending on the substrate medium.

The exact nature of this invention, as well as other objects and advantages thereof, will be readily apparent from consideration of the following specification relating to the annexed drawings in which.

Figure 2:
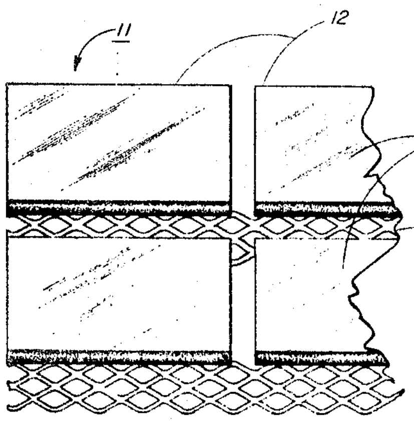
FIGURE 2 is a plan view of the top-side of the solar cell matrix of FIGURE 1.
Figure 1:
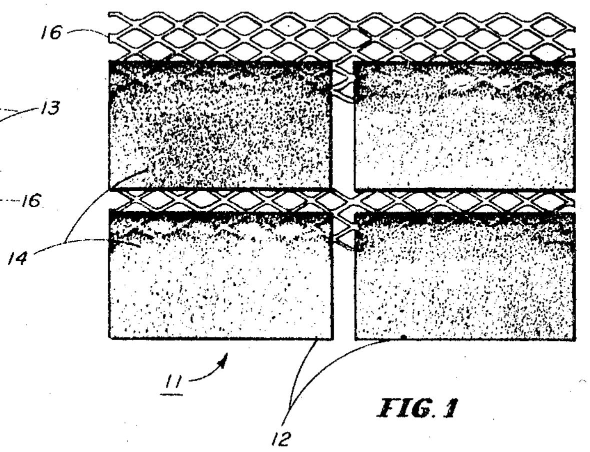
FIGURE 1 is a plan view of the under-side of a solar cell matrix embodying the present invention.

Referring now to the drawings, there is shown in FIGURES 1 and 2 a matrix 11 formed of P/N type semi-conductor solar cells 12 having a P or positive material (layer) 13 and a N or negative material (layer) 14 wherein the solar cells 12 are positioned as shown and interconnected by expanded metal interconnectors 16. As used herein, expanded metal is a very thin sheet of metal which has first had cuts made through the surface thereof and has then been pulled in a direction transverse to the cuts so that the cuts open up into substantially diamond shaped holes—the dimensions of the holes being determined by the amount that the sheet is pulled or stretched. Accordingly, from a thin solid sheet of a given width, a much wider sheet is developed by the fact that the solid sheet has been formed into a mesh configuration. In addition to being flexible, the mesh configuration results in the expanded metal becoming somewhat resilient.

Each expanded metal interconnector 16 electrically and mechanically connects a portion of all the N-material 14 of one row of solar cells 12 to an edge portion of all the P-material 13 of an adjacent row of solar cells 12 by an over-under technique. In actuality, each expanded metal interconnector 16 is a strip of expanded metal soldered to solar cells 12 so as to form a parallel electrical connection in its longitudinal direction and a series electrical connection in its transverse direction. It is important to note that the expanded metal interconnection strips 16 are affixed to solar cells 12 so that the mesh formation thereof is more dense in the transverse direction. By this it is meant that each of the diamond shaped spaces of the mesh is wider in the longitudinal direction of the strip than in the transverse direction. It has been found that an annealed silver expanded metal strip having diamond shaped spaces with the wider dimension being .187 inch, the narrower dimension being .05 to .07 inch and thickness being .002 inch performed very well as an interconnector.

Figure 3:
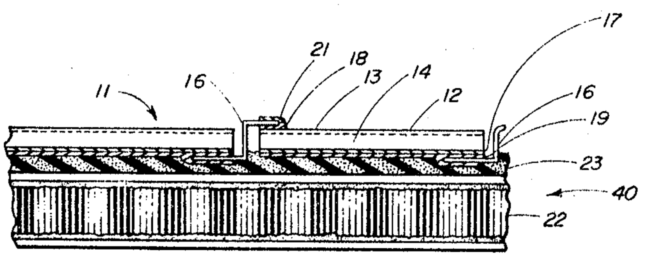
FIGURE 3 is a cross sectional view of an embodiment of the invention wherein the solar cell matrix of FIGURE 2 is mounted on a rigid substrate material.

FIGURE 3, in addition to illustrating solar cell matrix 11, of FIGURES 1 and 2, mounted on a substrate to form a solar cell array 40, shows the details of the solar cells 12 and the relationship of the component parts thereof with the expanded metal interconnector 16. Each P/N solar cell 12 of the silicon type comprises a P-material 13 and an N-materil 14. The entire surface of N-material 14 and a small surface along one edge of P-material 13 have coated thereon a thin layer of bonding material 17, 18, respectively, such as copper, nickel, silver or platinum, since solder will not adhere directly to silicon. Coated over the thin layer of bonding material 17, 18 is a thin layer of tin-lead solder 19, 21, respectively, the solder being necessary for the expanded metal interconnectors 16 to be easily joined to the solar cells 12. The expanded metal interconnector strips 16 are connected between the layer of solder 19 of all solar cells 12 in one row and the narrow layer of solder 21 of all the solar cells 12 in an adjacent row and held in place by solder.

With matrix 11 being affixed to an aluminum honeycomb substrate (base member) 22 by a flexible adhesive 23, such as room temperature vulcanizing silicon rubber, the solar cell array 40 is a rigid light weight structure capable of having a maximum solar cell surface available to light source. Due to the use of the expanded metal strips 16 the solar cell matrix provides excellent conductivity from cell to cell and at the same time is capable of satisfactorily withstanding vibrational and thermal shock.

While the description of the invention presented so far relates to a rigid structure, having the solar cells interconnected by expanded metal strips 16, it is important to realize that the expanded metal strips are equally adaptable to a flexible type of solar cell array, and, in fact, by being so used achieve the many advantages enumerated hereinabove. Such a flexible type of solar cell array, besides being both strong and flexible is, in addition, somewhat resilient due to the expanded metal interconnector elements. These characteristics not only permit the array to withstand a considerable amount of shock and vibration with no solar cell damage, but also permit the array either to be formed as an integral part of the outer shell of a satellite, since it can be readily made to take the shape of the satellite, or to be formed as a flexible structure to be housed within the satellite until it is released and extended therefrom.

Figure 5:
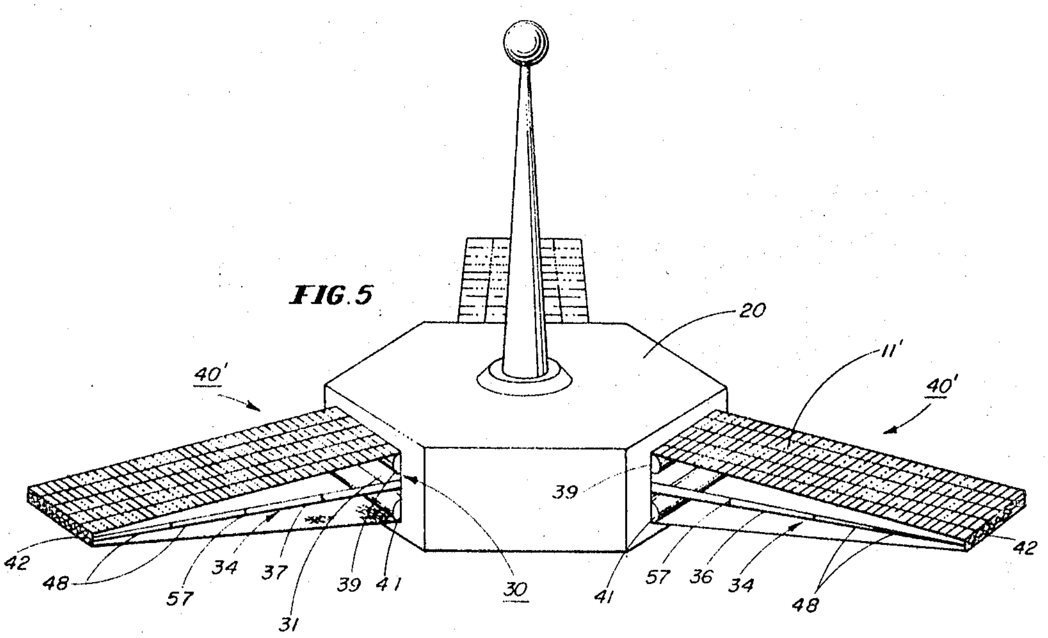
FIGURE 5 is a perspective view of a satellite having formed as an integral component thereof the invention as depicted in FIGURE 4 with the flexible matrix structure and bracing member in an extended position.
Figure 4:
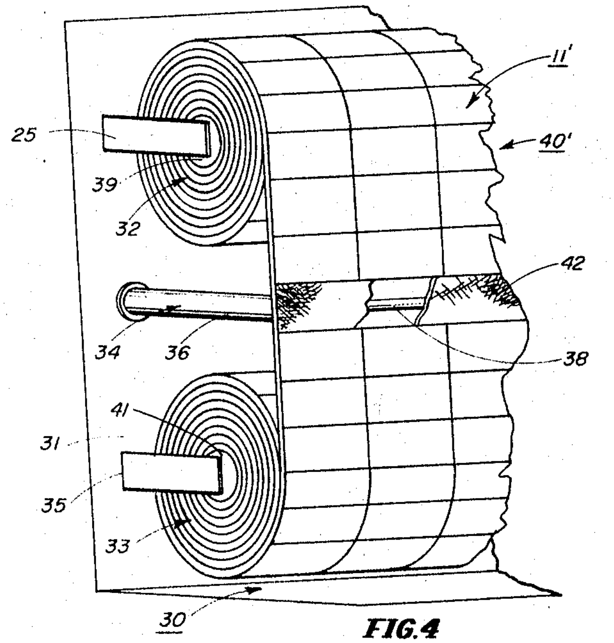
FIGURE 4 is a perspective view of the invention, in the form of a flexible matrix structure in combination with a bracing member, in its stored position.

As example of this latter type of solar cell array, used in conjunction with a satellite 20, is shown in FIGURES 4 and 5. While FIGURE 5 illustrates satellite 20 as having three such solar cell arrays 40', a greater or lesser number may be used depending on the design of the satellite and the power requirements thereof. A chamber 30, formed in the face of a satellite 20, as more readily seen in FIGURE 5, contains an inner wall 31 to which is attached two freely rotatable roller assemblies 32, 33 comprising braces 25, 35, respectively, and rollers 39, 41, respectively, the rollers being spaced apart and in parallel relationship. Between roller assemblies 32, 33 and parallel therewith is telescoping bracer member 34 comprising two parallel telescoping tubes 36, 37, affixed substantially perpendicular to wall 31, and a cross bar 38 (shown in more detail in FIGURE 7) connected to and between the extreme ends of telescoping tubes 36, 37.

Figure 6:
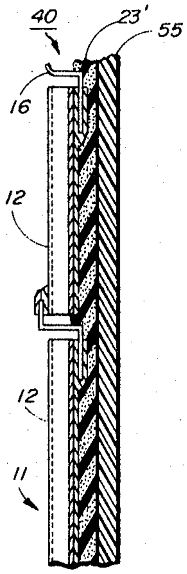
FIGURE 6 is an expanded side view of a portion of the solar cell array of FIGURE 5 shown mounted on a flexible substrate material.

Attached to and wound about rollers 39, 41 and over bar 38 is solar cell array 40' wherein matrix 11' thereof is constructed in a manner described in connection with FIGURES 1 and 2 above. As illustrated in FIGURE 6, attached to the underside of matrix 11' of solar cell array 40' is a substrate material 55 such as a fibre glass fabric coated with silicon rubber, the attachment being accomplished by an adhesive 23' such as room temperature vulcanizing silicon rubber. In addition to providing strength to matrix 11', the coated fibre glass fabric protects the solar cells by behaving as a soft cushion between the rolled-up layers of array 40'.

Substantially in the middle of solar cell array 40' and in contact with bar 38 is a rigid support member 42 to which bar 38 is attached. If so desired, bar 38 and support member 42 can be a unitized structure.

During the launch and flight of the satellite all appendages must initially be stored within or in close proximity to the satellite structure to allow a streamlined shroud to be placed about the satellite so that the satellite will offer the minimum air resistance during the launching vehicle flight. As can be readily seen in FIGURE 4, the flexible solar cell assembly is capable of meeting these requirements by the fact that it is stored with telescoping tubes 36, 37 in their contained (non-extending) condition and with the solar cell array 40' rolled on the rollers 39, 41 of roller assemblies 32, 33. While FIGURE 4 illustrates chamber 30 as being open, it may be closed by a door such as described in Raabe in Patent No. 3,098,229, or by a hatch held in place by lock members of the type disclosed in the same patent, the hatch itself to be released by the lock members and thrown clear of the satellite at a desired time.

The manner of storage of a large solar cell assembly, as described above, does not require the extension of the shroud surrounding the satellite as would be the case where larger solar cell paddles extend external of the satellite. In addition, the solar cell assembly, stored in the manner proposed herein, will better withstand vibrational and shock conditions, during the launch and launching vehicle flight stages, without taking up too much space within the satellite itself.

When satellite 20 is separated from the launching vehicle and put into orbital flight, the hatch (cover) of chamber 30, if one is used, is released by the lock members and thrown clear of the satellite itself. Then telescoping tubes 36, 37 are extended to their extreme position by mechanical, hydraulic, or gas operated means, for example. One such means, a gas operated type will be described in more detail hereinafter. As the telescoping tubes 36, 37 are extended they carry support member 42, and accordingly, solar cell array 40' with them, i.e., solar cell array 40' unwinds from rollers 39, 41 and forms the structure illustrated in FIGURE 5.

Figure 7:
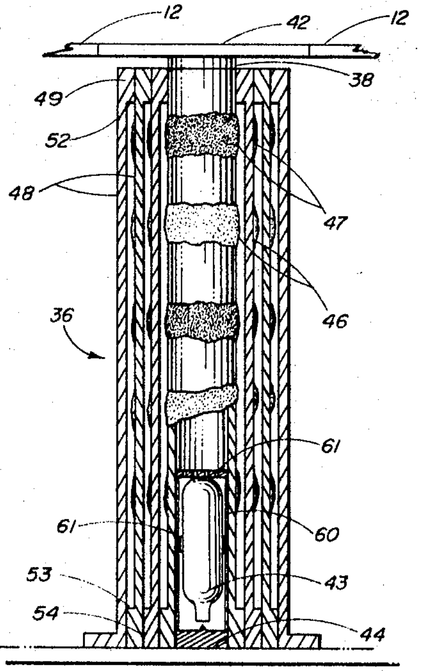
FIGURE 7 is a sectional view of the telescoping tube of the bracing member of FIGURE 4 showing a means for positioning the telescoping tube in its extended position.

In FIGURE 7 there is shown either telescoping tube 36 or 37 in a non-extending condition with a carbon dioxide ($CO_2$) cartridge 43 positioned internal thereof in a supporting container 60 having ports 61 therein to permit the passage of escaping gas from the $CO_2$ cartridge. When $CO_2$ cartridge 43 is pierced at an appropriate time by an actuating device 44, the $CO_2$ gas escapes and forces the telescoping tube into its fully extended position. It should be understood that while $CO_2$ gas is shown as a representative means for positioning telescoping tubes 36, 37, the invention is not limited thereto since various other equivalent means could be used equally as well.

Figure 8:
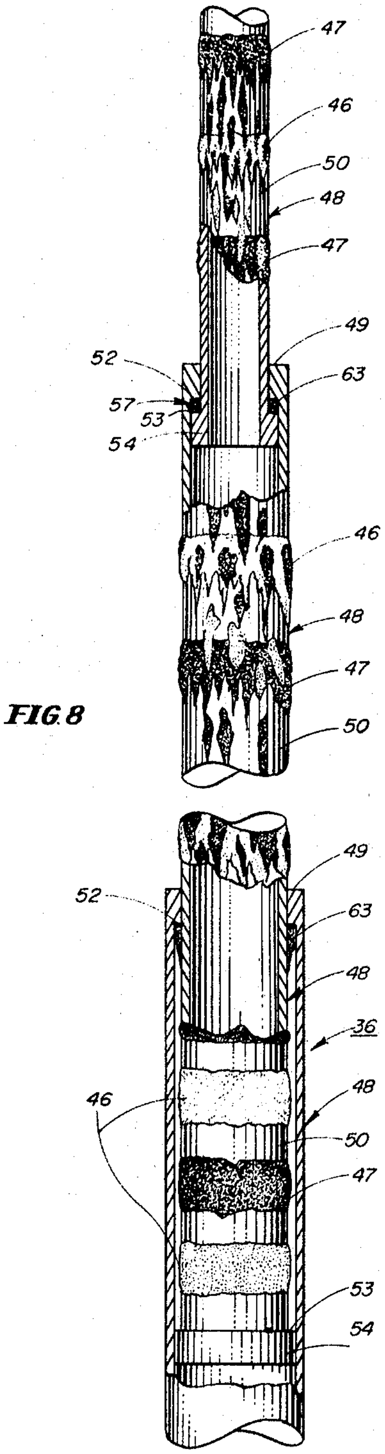
FIGURE 8 is a cut-away exploded view showing the internal and external interconnections of the adjacent sections of the telescoping tube with a portion of the telescoping tube in its extended position.

To insure that telescoping tubes 36, 37 remain in their fully extended position, means are provided to lock the various sections 48 of the telescoping tubes together at their junctions 57. One such means using an epoxy resin system is illustrated in FIGURE 8. An uncured viscous epoxy resin 46, such as a Hysol viscous filled epoxy and an amine viscous filled hardener 47 are coated on the outside surface 50 of each section 48 of the telescoping tubes 36, 37 to form a plurality of alternate annular sections of thickness of approximately 1 to 2 mils, width of approximately 1/16 inch and separation therebetween of approximately 1/4 to 1/2 inch. By coating outside surfaces 50 of sections 48 in this manner, activation of the epoxy system is prevented from occurring until the uncured epoxy resin 46 and hardener 47 make contact and mix.

As telescoping tubes 36, 37 are forced outwardly by the $CO_2$ gas each internal section 48 moves in a longitudinal direction away from each adjacent surrounding external section 48 and inner portions 52 of flanges 49 of the surrounding external sections 48 scrapes the uncured epoxy resin 46 and hardener 47 from outside surfaces 50 to mix them together. At the time that the telescoping tube is fully extended and the inner portions 52 of flanges 49 make contact with the outer portions 53 of flanges 54, the uncured epoxy resin 46 and hardener 47 contained therebetween are sufficiently mixed to react and form a cured epoxy resin 63 which cements flanges 49 and 54 together at junctions 57.

While the description just presented illustrated one novel method for holding the telescoping tubes in an extended position, other methods could be used equally as well. In fact, if a good seal is attained between all the junctions 57 of sections 48 forming the telescoping tubes 36, 37, the $CO_2$ gas itself could maintain the telescoping tubes in their extended position.

While the flexible solar array structure has been described hereinabove in use with a satellite, it can find application as an energy source for rugged electronic equipment, including receiving and transmitting sets, where it is essential that the energy source itself be rugged to withstand abuse and various environmental conditions. In such applications the solar cell array could be housed in a portable carrying case wherein terminals are provided for interconnecting the array to the electronic equipment. The array itself would be capable of being extended outwardly from the portable carrying case and deployed to utilize the maximum available sun's energy. Similarly, the flexible solar cell array could be used with commercial portable radios and various other electronic equipment as an energy source. It is to be noted that in such use the flexible solar cell array structure will be much smaller in size than disclosed for satellite application, but the operation thereof will be substantially the same.

Although the foregoing disclosure relates to preferred embodiments of the invention, it should be understood that numerous modifications or alterations may be made therein without departing from the spirit and scope of the invention set forth in the appended claims.

What is claimed is:

1. In a structure wherein thin, flat elements are to be electrically interconnected such that electrical conductive portions of the top surface of one element are electrically connected to electrical conductive portions of the bottom surface of an adjacent element, the improvement comprising: an expanded metal strip for electrically and mechanically interconnecting said conductive portions of said elements, and a conductive adhering means for attaching said expanded metal strip to said conductive portions.

2. In the structure of claim 1, said expanded metal strip having a mesh formation comprising diamond shaped holes wherein the dimension of each hole is wider in the longitudinal direction of said strip than in the transverse direction.

3. In an interconnecting means for a solar cell matrix wherein a plurality of semiconductor solar cells each has its entire lower surface and an edge of its upper surface coated with an electrical conductive solder material, the improvement comprising: expanded metal strips attached to said electrically conductive solder of said upper and lower layers for electrically interconnecting said plurality of solar cells.

4. In a solar cell matrix including a plurality of silicon junction type semiconductor solar cells lined up in successive rows and wherein the entire lower surface and an edge of the upper surface of each cell is coated with an electrical conductive solder material, the invention comprising: expanded metal strips for electrically and mechanically interconnecting said rows of solar cells in an over-under configuration, and means for attaching said strips to said electrical conductive solder on said surfaces whereby each expanded metal strip is connected between a portion of said coated lower surface of one row of solar cells and said coated edge of said upper surface of an adjacent row of solar cells.

5. In the solar cell matrix of claim 4, said expanded metal strips each having a mesh formation comprising diamond shaped holes, wherein the dimension of each hole is wider in the longitudinal direction of each of said strips than in the transverse direction.

6. A solar cell array comprising: a plurality of semiconductor solar cells, expanded metal strips for interconnecting said solar cells to form a solar cell matrix, adhering means to fasten said strips to said cells, a substrate medium and an adhesive for attaching said solar cell matrix to said substrate medium.

7. A flexible solar cell array comprising a plurality of thin, flat type solar cells, expanded metal strips for interconnecting solar cells of said array in an over-under configuration to form a solar cell matrix, adhering means to fasten said strips to said cells, a flexible substrate material and a resilient adhesive for attaching said solar cell matrix to said flexible substrate material.

8. The flexible solar cell array of claim 7 wherein said expanded metal strips have a mesh configuration of diamond shaped holes, each of said holes being wider in the longitudinal direction of each of said strips than in the transverse direction thereof.

9. The flexible solar cell array of claim 7 wherein said flexible substrate material is a fibre glass fabric coated with silicon rubber and said adhesive is room temperature vulcanizing silicon rubber.

10. An ejection type flexible solar cell array assembly for storage in a container comprising: a solar cell matrix wherein the solar cells are electrically interconnected with expanded metal strips in an over-under configuration, means attached to said matrix for holding said matrix within said container, and means attached to said matrix for extending said matrix from said container.

11. The ejection type flexible solar cell array assembly of claim 10 wherein said solar cell matrix is flexible and said means for holding said matrix in a contained condition is a roller structure including a roller member upon which said flexible matrix is wound and a bracket member for attaching said roller member to a wall of said container.

12. The ejection type flexible solar cell array assembly of claim 11 wherein said means for extending said matrix from said container is an extendable element attached between said wall and said matrix, whereby at a desired time said extendable element extends in an outward direction to unwind said flexible matrix from said roller and position it external of said container.

13. The ejection type flexible solar cell array assembly of claim 12 wherein said extendable element comprises telescoping tubings and which further includes within said telescoping tubings means for extending said telescoping tubings.

14. The ejection type flexible solar cell array assembly of claim 13 wherein said means for extending said telescoping tubings is gas held under pressure in a cartridge housed within each of said telescoping tubings.

15. The ejection type flexible solar cell array assembly of claim 13 further including means for holding said telescoping tubings in their extended condition, said means including annular sections of uncured viscous epoxy resin and an amine viscous filled hardener coated alternately on the outside surface of each section of said telescoping tubings, whereby as the sections of telescoping tubings move relevant to each other an end portion of each outer section will rub against the outer surface of an adjacent inner section and scrape said uncured epoxy resin and said amine viscous filled hardener and mix them together so that at the time each inner section is in its extreme position relevant to its adjacent outer section they are sufficiently intermixed to react to form a cured epoxy resin which cements said adjacent sections to form rigid telescoping tubings.

16. Means for holding a telescoping tubing in an extended rigid condition comprising: alternate annular sections of an uncured viscous epoxy resin and an amine viscous filled hardener coated on the outside surface of each section of said telescoping tubing; whereby as said telescoping tubing is extended outwardly an end of each outer section scrapes said uncured viscous epoxy resin and said amine viscous filled hardener from each adjacent inner section and intermixes them so that at the time the telescoping tubing is fully extended said end of each outer section has caused sufficient mixing to form a cured epoxy resin so that said end is cemented thereby to an end of the adjacent inner section with which it is associated.

References Cited

UNITED STATES PATENTS

| | | | |
|---|---|---|---|
| 2,569,810 | 10/1951 | Hamel et al. | 343—877 X |
| 2,909,586 | 10/1959 | Hagspihl | 136—36 |
| 2,989,575 | 6/1961 | Wallace | 136—89 |
| 3,005,862 | 10/1961 | Escoffery | 136—89 |
| 3,160,527 | 12/1964 | Hess | 136—86 |
| 3,245,636 | 4/1966 | Null | 244—1 |
| 3,094,439 | 6/1963 | Mann et al. | 136—89 |
| 3,346,419 | 10/1967 | Forehand et al. | 244—1 X |
| 3,375,141 | 3/1968 | Julius | 136—89 |

OTHER REFERENCES

Flight International, Oct. 10, 1963, p. 623.

FERGUS S. MIDDLETON, Primary Examiner

U.S. Cl. X.R.

136—89; 161—186; 174—68, 117; 310—4; 343—705